United States Patent
Mehta (10) Patent No.: US 9,750,157 B1
(45) Date of Patent: Aug. 29, 2017

(54) RACK DOOR FOR MOUNTING POWER DISTRIBUTION UNITS

(71) Applicant: ZT Group Int'l, Inc., Secaucus, NJ (US)

(72) Inventor: Karan Mehta, Garfield, NJ (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 0 days.

(21) Appl. No.: 15/233,619

(22) Filed: Aug. 10, 2016

(51) Int. Cl.
*H05K 7/14* (2006.01)
*H05K 5/02* (2006.01)

(52) U.S. Cl.
CPC ......... *H05K 7/1492* (2013.01); *H05K 5/0204* (2013.01); *H05K 5/0226* (2013.01); *H05K 5/0247* (2013.01); *H05K 7/1401* (2013.01); *H05K 7/1491* (2013.01)

(58) Field of Classification Search
CPC ............... H05K 7/1492; H05K 5/0204; H05K 7/1491; H05K 5/0226; H05K 5/0247; H05K 7/1401
USPC ................................ 361/622, 679.01, 679.02
See application file for complete search history.

(56) References Cited

U.S. PATENT DOCUMENTS

| 2014/0069680 | A1* | 3/2014 | Alshinnawi | H05K 7/1492 174/82 |
| 2014/0071602 | A1* | 3/2014 | Alshinnawi | H05K 7/1492 361/679.02 |
| 2014/0168892 | A1* | 6/2014 | Liang | G06F 1/181 361/679.58 |
| 2015/0181747 | A1* | 6/2015 | Bailey | H05K 7/20736 361/679.48 |
| 2017/0111451 | A1* | 4/2017 | Thul | H04L 67/125 |
| 2017/0164502 | A1* | 6/2017 | Cox | H05K 7/1491 |

* cited by examiner

*Primary Examiner* — Anthony Haughton
*Assistant Examiner* — Yahya Ahmad
(74) *Attorney, Agent, or Firm* — Dergosits & Noah LLP; Todd A. Noah (57) ABSTRACT

A rack door is disclosed for mounting one or more power distribution units (PDUs) to the front of a server rack. An embodiment allows access to power cables when the rack door is open or closed. An embodiment provides power cable routing that allows power cables from one PDU to be connected or disconnected independently from other cables on that same PDU or on another PDU mounted to the rack door.

20 Claims, 6 Drawing Sheets

RACK DOOR FOR MOUNTING POWER DISTRIBUTION UNITS

BACKGROUND

In a data center environment, a server rack may be positioned between a hot aisle and a cold aisle to achieve a higher cooling efficiency. In the typical configuration, the ambient or cold air temperature aisle is at the front of the rack and the hot aisle is at the back. In a typical arrangement, one or more power distribution units (PDUs) are located at the back of the server.

But other arrangements are possible. Front-access servers and switches are servers and switches where the connections for power cables (or "cords") and ports are located on the front of the server. Front-access arrangements present advantages related to the convenience of having most or all connections on the same side of the server or switch.

Having the PDUs located at the back of the rack and the server and switch power ports located at the front of the rack makes it difficult to determine which power cable at the rear PDU corresponds to which front server or switch. In other words, it is difficult to fish out the correct power cable without being able to see both ends at the same time. The distance from rear PDU to front port also increases cable lengths and related costs. And the typical rack does not have the space in front to facilitate moving a PDU to the front of the rack. However, even if space existed, mounting a PDU to the front of a rack would interfere with servicing, installing, and uninstalling servers.

Thus, a typical rack is not optimally equipped to accept servers and switches with front-mounted power and signal connections. Therefore, the need exists for a solution that allows a PDU to be mounted on the front of a rack as well.

DETAILED DESCRIPTION

In an embodiment, a rack door for mounting on the front of a rack is equipped with mounts for PDUs and configured to organize the associated cabling for powering servers and switches with front-mounted power connections.

In an embodiment, a rack door is designed to accommodate four half-height PDUs, and is configured so that the half-height PDUs may be from vendors whose PDUs have different mounting arrangements. For example, the PDUs from Delta, AcBel, and Servertech require slightly different mounts. In an embodiment, four PDUs from Delta, AcBel, or Servertech may be mounted onto the rack door, or four PDUs chosen from among Delta, AcBel, and Servertech PDUs may be mounted onto the rack door. In an embodiment, the rack door itself is designed so that it may be mounted to different racks. For example, the racks from Rittal TS8 and AFCO have different front configuration and in an embodiment the rack door is configured so that it may be mounted to a Rittal TS8 rack or an AFCO rack.

In an embodiment, features of a rack door include: 1) a staggered PDU orientation that staggers the receptacles on PDUs, allowing a power cable to be routed from a PDU to the server without being obstructed by another power cable; 2) clips, such as fir tree clips, on the front of the rack door to stabilize and organize each power cable, and also provide a retaining force for each individual power cord; 3) a cable management duct to collect and organize power cables as they pass from the servers or switches to the PDUs; 4) an adjustable latch that allows the rack door to latch to a rack from different vendors (e.g., to an AFCO and a Rittal rack frame); and 5) one or more detent hinges that allows the rack door to maintain hold-open positions of, for example, 80°, 115°, and 150° positions. Many of these features improve cable routing or serviceability or both. In contrast, with a typical server, rack, and PDU arrangement all the power cables between a PDU and the respective rack-mounted equipment might be bundled together, requiring that the entire bundle be disconnected in order to service one of the rack-mounted devices.

In an embodiment, a rack door is a 42U rack door in which up to four half-height PDUs may be mounted. This embodiment allows for the cabling from the PDUs to the rack-mounted equipment to be managed within the door in the open or closed positions. In other words, the embodiment allows for each of the power cables to be connected to or disconnected from the PDU when the rack door is open and when the rack door is closed. The embodiment further allows an individual server to be serviced without having to unplug any of the other functioning servers in the rack, and manages the cables from the PDUs to the rack-mounted equipment such that an individual rack-mounted piece of equipment can be easily installed or removed for service. The embodiment thus provides a single, integrated solution for three crucial functions: PDU mounting, power cable routing, and power cable management between the nodes and PDUs.

An embodiment discloses a rack door for mounting at least one power distribution unit (PDU) and for providing access to PDU receptacles from both sides of the rack door. The rack door is mountable to a rack. The rack door may includes a first face (e.g., an inner face), a second face opposing the first face (e.g., an outer face), a first edge (e.g., a hinge side), and a second edge opposing the first edge. The rack door may be configured near the first edge to mount to a front section of a rack such that the rack door may open and close with respect to the rack. The rack door may include a first PDU mount disposed on the first face for mounting a first PDU. The PDU mount may be arranged to orient the PDU so that the PDU power output sockets are oriented toward the first edge. The rack door may include a first open space that is disposed between the first PDU mount and the first edge, with the first open space configured to allow access from the second face through the rack door to each of the PDU power output sockets (when a PDU is eventually mounted).

In an embodiment, the rack door as described in the previous paragraph may include a second PDU mount disposed on the first face for mounting a second PDU. The second PDU mount may be disposed to orient the power output sockets on the second PDU toward the first edge. The rack door may have a second open space between the second PDU mount and the first PDU mount. The second open space may be configured to allow access from the second face through the rack door to each of the PDU power output sockets on the second PDU (when the second PDU is eventually mounted). The second PDU mount and the second open space may be disposed on the rack door such that the first and second open spaces allow a routing of each of the second plurality of power cables from the second PDU through the second open space, along a section of the second face ("behind" the first PDU), then through the first open space to the first edge. This routing would allow the mounting or dismounting of the first PDU without disconnecting cables from the second PDU, and allowing the mounting or dismounting of the second PDU without disconnecting cables from the first PDU.

Figure 1:
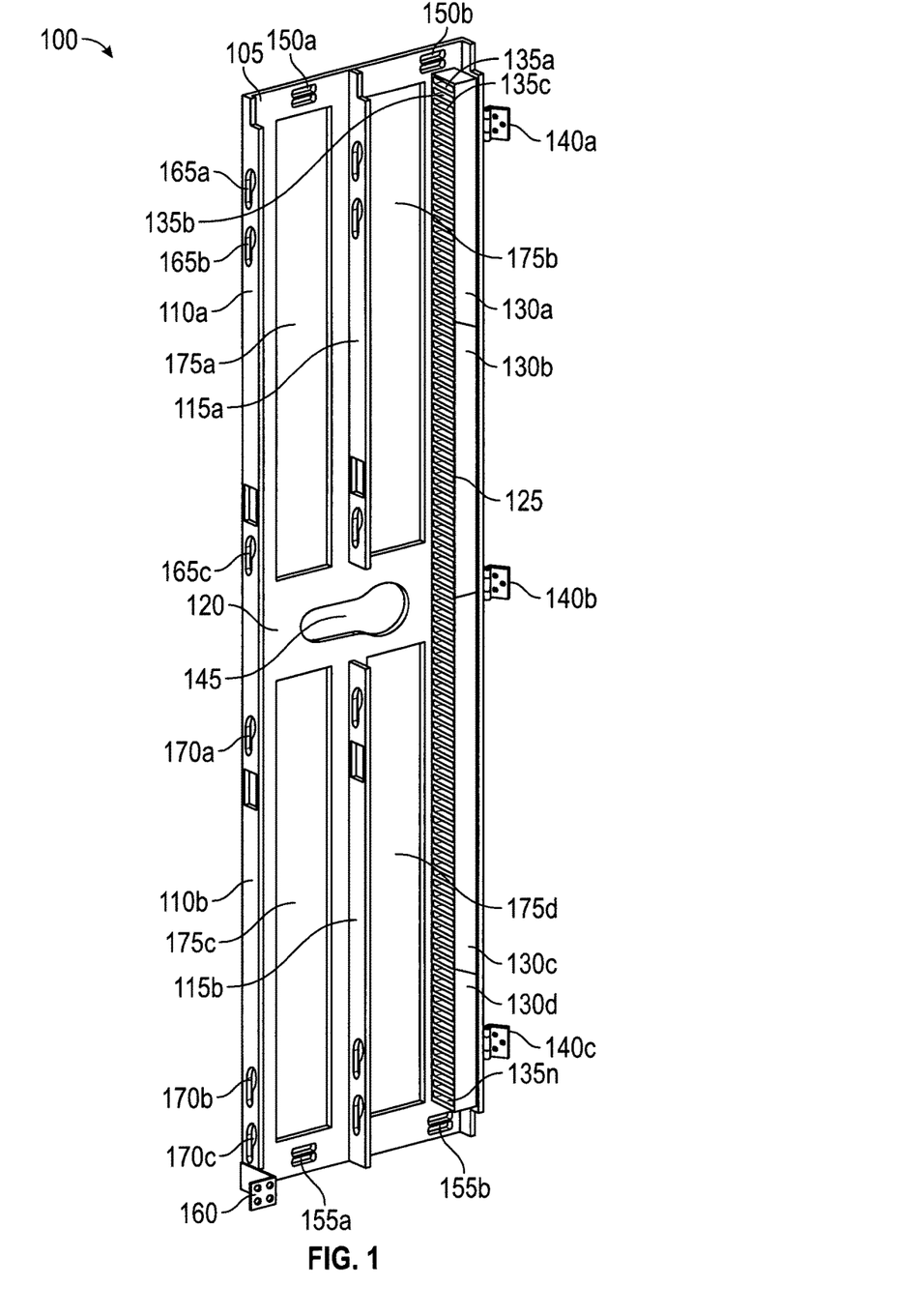
FIG. 1 is a perspective drawing illustrating an embodiment of a rack door.

Embodiments of the rack door will now be described with reference to the figures. FIG. 1 is a perspective drawing illustrating an embodiment of a rack door 100. FIG. 1 depicts the side, or "face," of rack door 100 that would face a rack, if rack door 100 was mounted and closed. Rack door 100 includes a door frame 105. Door frame 105 has outer frame sections 110a, 110b, middle frame sections 115a, 115b, and a center frame section 120. The frame sections are generally for supporting the features of rack door 100. Outer frame section 110a includes upper PDU mounting slots 165a, 165b, 165c. A single PDU may be mounted using one or more of mounting slots 165a, 165b, 165c as will be described within. Middle frame section 115a has similar upper PDU mounting slots (not shown) that are offset from upper PDU mounting slots 165a, 165b, 165c to stagger the power cables from PDUs mounted to outer frame section 110a and middle frame section 115a. Outer frame section 110b includes lower PDU mounting slots 170a, 170b, 170c.

A single PDU may be mounted using one or more of mounting slots 170a, 170b, 170c as will be described within. Middle frame section 115b has similar lower PDU mounting slots (not shown) that are offset from lower PDU mounting slots 170a, 170b, 170c to stagger the power cables from PDUs mounted to outer frame section 110b and middle frame section 115b. At an inner section of door frame 105, rack door 100 includes a cable duct 125 for housing excess power cable and reducing slack, thereby reducing confusion that may be caused by overlapped and intertwined power cables. Cable duct 125 includes duct covers 130a, 130b, 130c, 130d, which may be removed to accept a power cable between duct slots 135a, 135b, 135c-135n, and then replaced to retain and house the power cable. Duct covers 130a-130d may be removed individually to provide access to one particular section of cable duct 125 and minimize disturbing the arrangement of power cables contained in other sections of cable duct 125. Duct slots 135a-135n are discussed further with respect to FIGS. 6a and 6b. At the inner edge of rack door 100, hinges 140a, 140b, 140c are provided for attaching rack door 100 to a rack. Rack door 100 includes open spaces 175a-175d for providing access to PDUs, to the power cables that lead to servers, switches, and other rack-mounted devices, and to the power cables (also known as "whips") that provide power to the PDU, itself. Open spaces 175a-175d also allow air to pass to increase rack thermal efficiency, make PDU circuit breakers visible and accessible from outside the door, and reduce door weight. Center frame section 120 includes a keyhole 145 for routing the whips from the PDU breaker to the power source. Rack door 100 further includes upper slots 150a, 150b and lower slots 155a, 155b, which may be used with, for example, Velcro ties or zip ties to secure the whips to rack door 100 (See FIG. 5). A door latch 160 may be used to retain rack door 100 in a closed position relative to a rack. Door latch 160 may be foot-operated.

In the embodiment, open spaces 175a-175d allow a user to reach through rack door 100 and connect or disconnect individual power cables from PDUs mounted on rack door 100 even if rack door 100 is closed. Open spaces 175a-175d also allow a user to route power cables through them so that power cables from an outer PDU (e.g., a PDU mounted used upper slots 165a, 165b, 165c on outer frame section 110a) do not need to be routed over and thereby trap an inner PDU (e.g., a PDU mounted using upper slots on middle frame section 115a). Rather, for example, power cables from a PDU mounted on outer frame section 110a may be routed out through open space 175a, behind middle section 115a, and then back in through open space 175b to cable duct 125 and onward to the appropriate rack-mounted equipment. Then, power cables from a PDU mounted on middle frame section 115a may be routed directly from the PDU to cable duct 125. Such power cable routing allows either the outer PDU or the inner PDU to be disconnected and removed without having to interrupt the other PDU.

In the embodiment, upper PDU mounting slots 165a, 165b, 165c are adapted to accommodate two different PDU mounting arrangements. In a first mounting arrangement, a PDU may be mounted using upper mounting slots 165c and 165a. In a second mounting arrangement, a PDU may be mounted using upper mounting slots 165a and 165b. Similarly, the mounting slots on outer frame section 110b and middle frame sections 115a, 115b are adapted to accommodate two different PDU mounting arrangements. In this way, rack door 100 may accommodate PDUs with different mounting arrangements without needing to be modified.

In an embodiment, one or more of hinges 140a, 140b, 140c may have one or more detents that, when rack door 100 is mounted to a rack, work to maintain rack door 100 at a pre-determined position relative to the rack, while still allowing door 100 to be swung between fully open and fully closed if the user desires. In an embodiment, the detents may be at 80, 110, and 150 degrees. Maintaining rack door 100 open at these angles may provide the following benefits. With rack door 100 maintained open at 80 degrees, a user may access both the inner and outer faces of rack door 100, as well as all PDU connections, cable duct 125, and connections on the front of the rack-mounted devices. Rack door 100 would not overlap an adjacent server rack and hinder someone working on that adjacent rack. With rack door 100 maintained open at 115 degrees, a user may have improved access to the inner face of rack door 100, as well as all PDU connections, cable duct 125, and connections on the front of the rack-mounted devices. Further, rack door 100 would not completely overlap an adjacent server rack and prevent someone from working on that adjacent rack. With rack door 100 maintained open at 150 degrees, a user may have complete access to the inner face of rack door 100 and to all rack-mounted server devices. At the same time, rack door 100 would not be contacting an adjacent server rack.

These particular detent angles are exemplary and the same benefits may be obtained by different angles depending on, for example, the geometries of the particular door, the rack to which the door is mounted, and the adjacent rack. In an embodiment, hinges 140a, 140b, 140c may be mounted to a customized hinge bracket (not shown) that is able to mount door 100 to racks from various vendors (such as AFCO & Rittal). Modifications to the hinge bracket may allow the door to be mounted on racks of different manufacturers without having to modify hinges 140a, 140b, 140c. In an embodiment, hinges 140a, 140b, 140c may be repositioned on rack door 100 to accommodate different mounting arrangements without further modifying rack door 100. Similarly, in an embodiment, latch 160 may be adapted to engage latching hardware of two different types, and its position may be adjustable to allow it to engage different latching hardware.

Though FIG. 1 depicted the side, or "face," of rack door 100 that would face a rack, if rack door 100 was mounted, it should be understood that features of rack door 100 may be equally beneficial if located on the other side or face of rack door 100. For example, PDU mounting slots and PDUs may be mounted on the "outside" of rack door 100.

Figure 2:
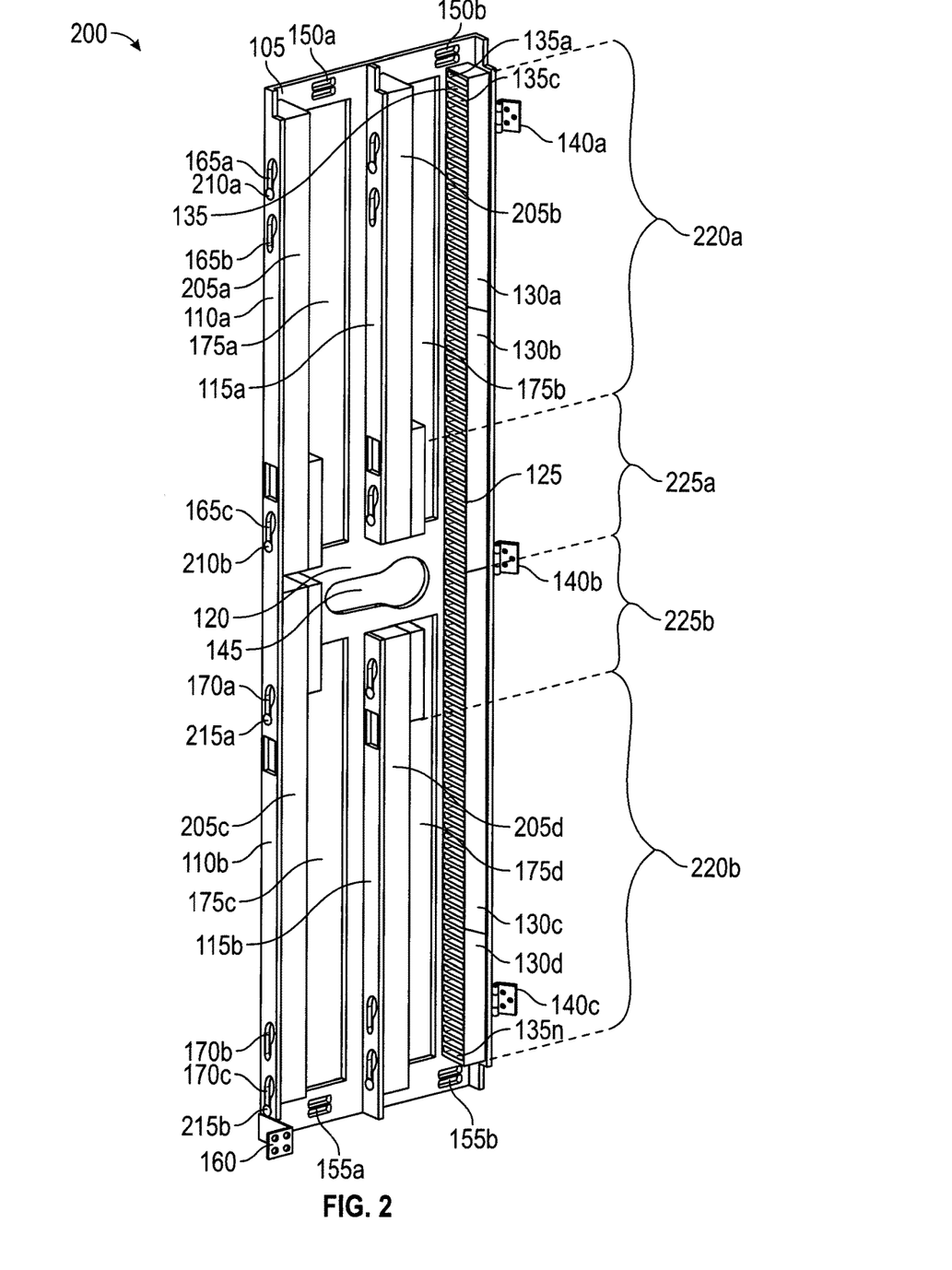
FIG. 2 is a perspective drawing illustrating an embodiment of a rack door.

FIG. 2 is a perspective drawing illustrating an embodiment of a rack door 200. FIG. 2 again depicts the side, or "face," of rack door 200 that would face a rack, if rack door 200 was mounted and closed. In FIG. 2, rack door 200 includes the features of rack door 100 from FIG. 1. In addition, rack door 200 includes PDUs 205a, 205b, 205c, 205d, which have been mounted to outer frame section 110a, inner frame section 115a, outer frame section 110b, and inner frame section 115b, respectively. PDUs 205a, 205b are oriented so that breaker sections 225a are below power cable connector areas 220a. PDUs 205c, 205d are mounted so that breaker sections 225b are above power cable sections 220b. This mounting arrangement locates breaker sections 225a, 225b near keyhole 145. PDU "whips" may then be bundled and passed through keyhole 145 and connected to the appropriate PDU. In an embodiment, PDU power connections in breaker sections 225a and power cable connector areas 220a may be accessed through one of open spaces 175a, 175b, 175c, or 175d. In other words, power cables may be plugged in, or unplugged through one of open spaces 175a, 175b, 175c, or 175d. Power cable cables may also be routed through open spaces 175a, 175b, 175c, or 175d.

For example, power cables from PDU 205a may be routed out through open space 175a, behind PDU 205b and middle section 115a, and then back in through open space 175b to cable duct 125 and onward to the appropriate rack-mounted equipment. Then, power cables from PDU 205b may be routed directly from PDU 205b to cable duct 125. Such power cable routing allows PDU 205a to be completely removed without interrupting the operation of PDU 205b, and vice versa.

In the embodiment of FIG. 2, the mounting slots in outer frame sections 110a, 110b and middle frame sections 115a, 115b are positioned with respect to the face of rack door 200 so that PDUs 205a-205d are oriented with their sockets to the right, facing cable duct 125. Other embodiments may orient the PDUs differently. For example, PDUs 205a and 205c may be flipped so that their receptacles are facing to the left, away from cable duct 125. Mounting slots for this arrangement may be added to middle frame sections 115a, 115b. With PDUs 205a, 205c being mounted to middle sections 115a, 115b, outer frame sections 110a, 110b are no longer needed. Thus, outer frame sections 110a, 110b may be deleted from the rack door. With PDUs 205a, 205c flipped in this manner and outer frame sections 110a, 110b removed, open spaces 175a, 175c are no longer bounded on the outer side and the receptacles for PDUs 205a, 205c are accessible from the outer side. This arrangement provides the advantages of the arrangement depicted in FIGS. 1 and 2. For example, with PDUs 205a, 205c in the reversed or "flipped" arrangement and outer frame sections 110a, 110b removed, power cables from PDU 205a may be simply be routed behind PDU 205b and middle section 115a, and then back in through open space 175b to cable duct 125, and then onward to the appropriate rack-mounted equipment. Then, as in FIGS. 1 and 2, power cables from PDU 205b may be routed directly from PDU 205b to cable duct 125. Again, such power cable routing allows PDU 205a to be completely removed without interrupting the operation of PDU 205b, and vice versa.

In an embodiment, a PDU may be mounted at one edge of a rack door with a second PDU mounted at the opposing edge of the rack door. The PDU may be oriented so that their receptacles face toward the other PDU, i.e., each PDU has its receptacles oriented toward the center of the rack door. The embodiment may then have a center open space between the PDUs through which a user may access the receptacles on both PDUs. Furthermore, power cables from both PDUs may be routed out through the center open space and then to a cable duct. The embodiment allows either PDU to be removed without interrupting the functioning of the other PDU.

Figure 3:
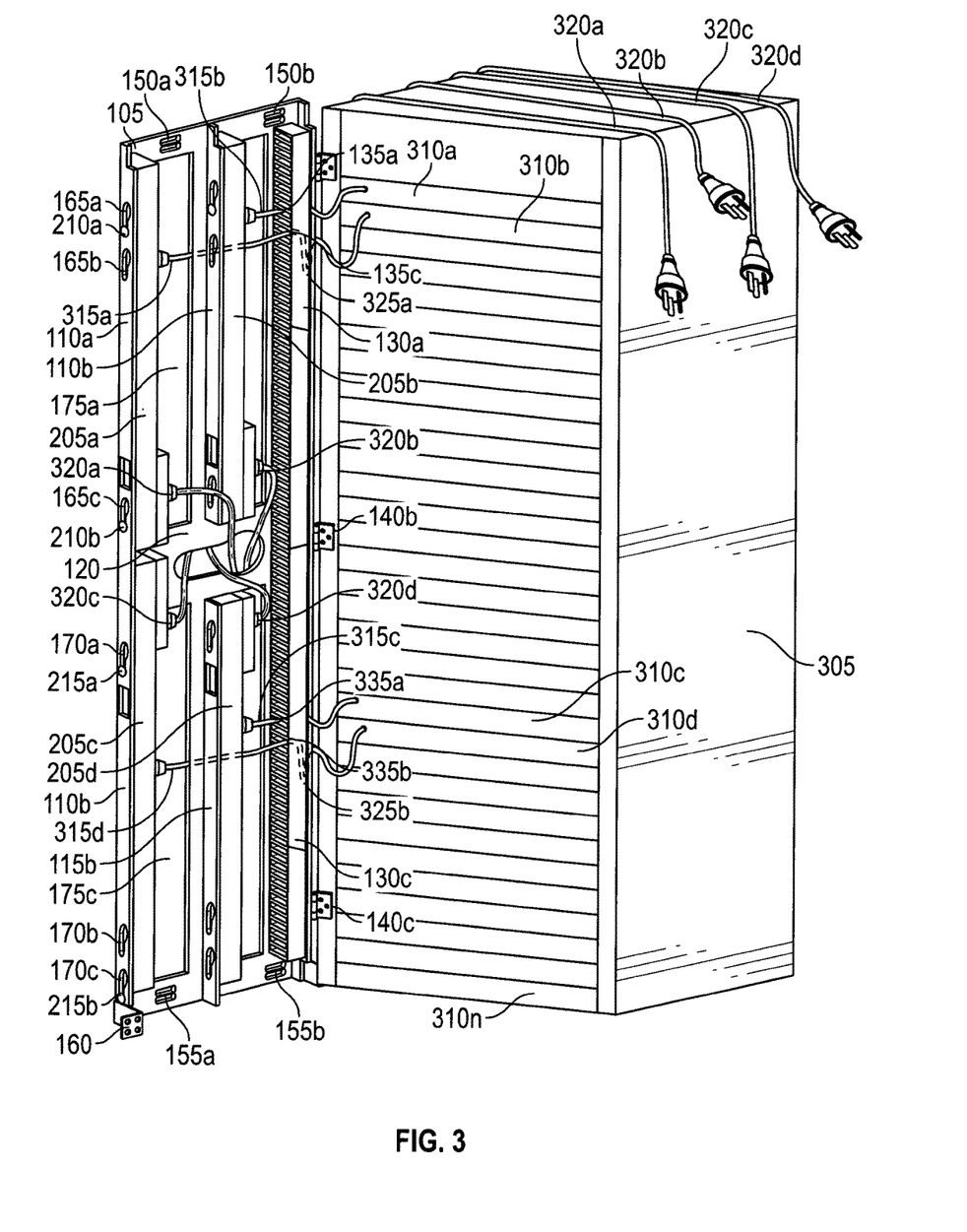
FIG. 3 is a perspective drawing illustrating an embodiment of a rack door attached to a rack.

FIG. 3 is a perspective drawing illustrating an embodiment of a system 300 with rack door 200 attached to a rack 305. In FIG. 3, rack 305 has been populated with devices 310a, 310b-310n. Devices 310a-310n may be, for example, servers, switches, or other rack-mounted equipment. Devices 310a, 310b-310n may be supplied with power with power cables connected to one of PDUs 205a, 205b, 205c, or 205d. For example, device 310a is connected to PDU 205b by a power cable 315b that is routed though duct slot 135a of cable duct 125. Device 310c is similarly connected by a power cable 315c through a duct slot 335a to PDU 205d. Device 310b has a different power cable routing. Device 310b is connected to PDU 205a by a power cable 315a that is routed though duct slot 135c of cable duct 125. Power cable 315a is routed through duct slot 135c and behind PDU 205b (and also behind middle section 115a) before being connected to PDU 205a. Power cable 315d is similarly routed between device 310d and PDU 205c.

PDUs 205a and 205b are shown in a staggered mounting arrangement—the upper end of PDU 205b is above the upper end of PDU 205a. Similarly, the terminal receptacle in PDU 205b is above the terminal receptacle in PDU 205a. In this manner, all the receptacles of PDU 205a and 205b are staggered. With the receptacles staggered, power cables 315a and 315b may each be run to a slot in duct 125 without overlapping another power cable. This allows for the quick identification of which power cable attached which PDU to which rack-mounted device. Power cable 315a is shown routed through duct slot 135c, but power cable 315a may also be routed through duct slot 135b without causing overlap or confusion.

In FIG. 3, a bight 325a is a slack section of power cable 315a that is housed by cable duct 125. Similarly, a bight 325b is a slack section of power cable 315d that is also housed by cable duct 125. Bight 325a may be accessed and power cable 315a removed from cable duct 125 after removing duct cover 130a. This is discussed further with regard to FIGS. 6a and 6b. Since each power cable routed through cable duct 125 may have slack that allows forming such bights, multiple bights may overlap each other within cable duct 125. For clarity, the overlapping of bights is not depicted. To allow for movement of cable duct 125 with respect to devices 310a, 310b when rack door 200 swings open, some slack may remain in the power cables between cable duct 125 and the rack-mounted devices.

FIG. 3 also shows system 300 has PDU whips 320a-320d connected to PDUs 205a-205d, respectively. PDU whips 320a-320d are then routed out through keyhole 145. PDU whips 320a-320d are then available for connecting to a power source, as shown atop rack 305.

As discussed with regard to FIG. 2, in other embodiments, PDUs may be oriented differently. For example, PDUs 205a and 205c may be flipped so that their receptacles are facing to the left, away from cable duct 125. Mounting slots for this arrangement may be added to middle frame sections 115a, 115b. With PDUs 205a, 205c being mounted to middle sections 115a, 115b, outer frame sections 110a, 110b are no longer needed. Thus, outer frame sections 110a, 110b may be deleted from the rack door. With PDUs 205a, 205c flipped in this manner and outer frame sections 110a, 110b removed, open spaces 175a, 175c are no longer bounded on the outer side and the receptacles for PDUs 205a, 205c are accessible from the outer side. This arrangement provides the advantages of the arrangement depicted in FIGS. 1-3. For example, with PDUs 205a, 205c in the reversed or "flipped" arrangement and outer frame sections 110a, 110b removed, power cable 315a from PDU 205a may be simply be routed behind PDU 205a, and then behind PDU 205b (and middle section 115a), then back in through open space 175b to slot 135c of cable duct 125, and then onward to device 310b. Then, as in FIGS. 1-3, power cable 315b from PDU 205b may be routed directly from PDU 205b to duct slot 135a and on to device 310a. Again, such power cable routing allows PDU 205a to be completely removed without interrupting the operation of PDU 205b, and vice versa.

Figure 4:
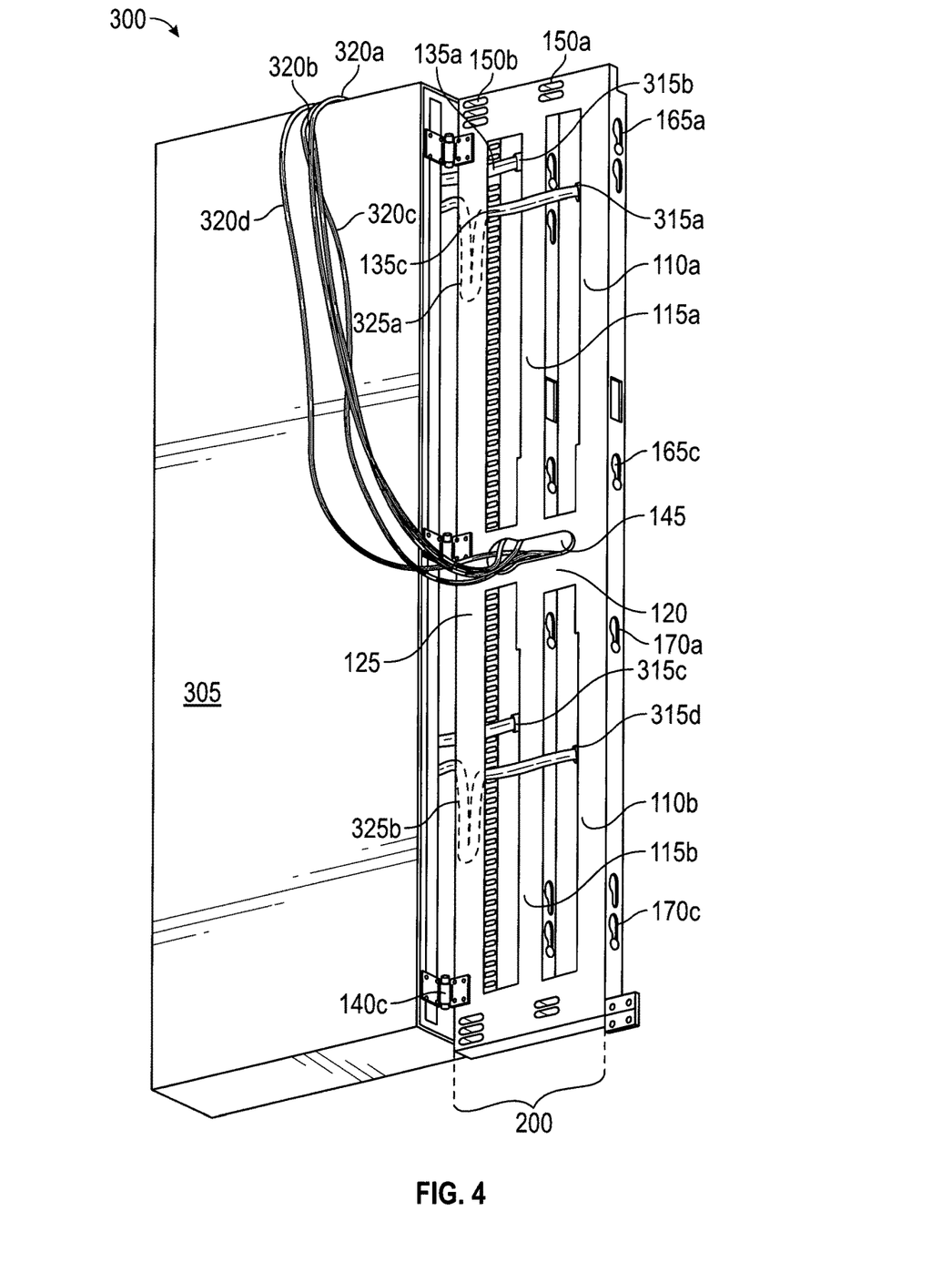
FIG. 4 is a perspective drawing illustrating an embodiment of a rack door attached to a rack.

FIG. 4 is a second perspective drawing illustrating an embodiment of system 300 of rack door 200 attached to rack 305. FIG. 4 depicts the outer face of rack door 200, i.e., the side of rack door 200 that faces out when rack door 200 is closed against rack 305. In FIG. 4, power cable 315a is shown routed behind middle frame section 115a and into duct slot 135c of cable duct 125. Power cable 315d is shown similarly routed. And power cables 315b and 315c are shown routed directed into cable duct 125.

Figure 5:
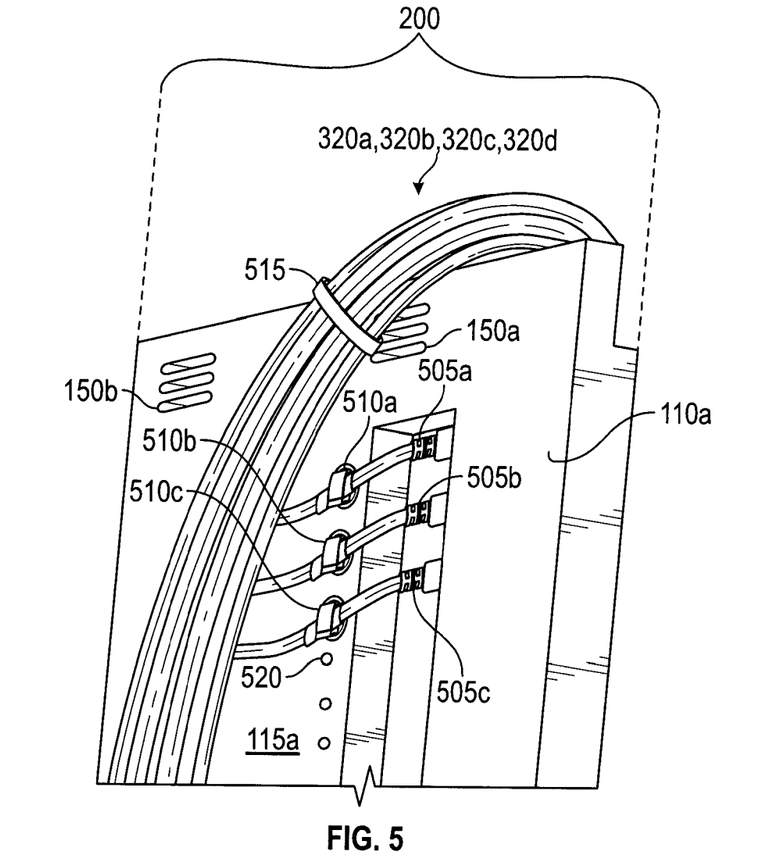
FIG. 5 is a perspective drawing illustrating aspects of an embodiment of a rack door.

In an embodiment, all power cords pass through fir tree clips (e.g., 510a, 510b, 510c, FIG. 5) for retention. Power cords from outer PDUs 205a and 205c go through fir tree clips installed on frame sections 115a and 115b respectively as shown in FIG. 5. Power cords from inner PDUs 205b and 205d pass through fir tree clips adjacent to cable duct 125.

In an embodiment, rack door 200 may be configured so that each of the four PDU positions shown may mount a half-height PDU from any of Delta, AcBel, or Servertech. In an embodiment, rack door 200 and hinges 140a, 140b, 140c may be configured to mount to a rack 305, where rack 305 may be from Rittal TS8 or AFCO.

In an embodiment a rack door may be configured to accept quarter-height PDUs or full height PDUs without departing from the claimed subject matter. For example, outer frame section 110a may have added mounting slots enabling two quarter-height PDUs to be mounted in place of the single half-height PDU. Similarly, a full-height PDU may be mounted in place of half-height PDUs 205a and 205c.

In an embodiment, the location of cable duct 125, hinges 140a, 140b, 140c may be changed to the other edge of rack door 200 so that power cables PDU 205a may be routed out through open space 175a, behind PDU 205a, and to a slot within the re-positioned cable duct. Power cables from PDU 205b may be routed out through open space 175b, behind PDU 205b, then behind PDU 205a, and to a slot within the re-positioned cable duct. This orientation would still allow each PDU 205a, 205b to be removed without interrupting the other.

FIG. 5 is a perspective drawing illustrating certain details of an embodiment of a rack door 200. In FIG. 5, rack door 200 is depicted with power cables 505a, 505b, 505c routed across the outer face of middle frame section 115a. As shown, power cables (e.g., power cables 505a, 505b, 505c) may also be plugged into, or unplugged from, the PDUs from this side of rack door 200. In an embodiment, middle frame section 115a has been fitted with clips 510a, 510b, 510c for holding and organizing power cables 505a, 505b, 505c, respectively. Stabilizing power cables with clips in this manner may result in a more stable connection between the power cable and the PDU, which could prevent undesired disconnections and power outages. Clips 510a, 510b, 510c, may be, for example, fir tree clips fitted into appropriately size holes, e.g., hole 520. FIG. 5 also shows that whips 320a-320d may be bundled and secured to rack door 200 using a tie 515 through slots 150a. Tie 515 may be, for example, a Velcro tie, or a zip tie. Securing whips 320a-320d in this manner may reduce the movement of whips 320a-320d with respect to rack door 200, which may also prevent undesired disconnections and power outages.

Figure 6A:
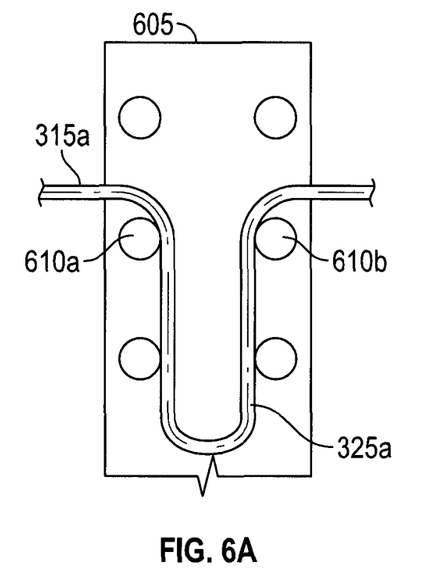
FIG. 6a is a drawing illustrating aspects of an embodiment of cable duct.

FIG. 6a is a drawing illustrating an embodiment of cable duct 125. In FIG. 6a, a cable duct 605 is one embodiment of cable duct 125 depicted in FIGS. 1-5. Cable duct 605 is shown without a duct cover for clarity. Cable duct 605 include duct fingers 610a, 610b for supporting a power cable. A space created between duct fingers 610a, 610b may accept excess power cable slack. Thus, a duct slot, e.g., duct slot 135c, may be created by the space between upper and lower pairs of duct fingers and a power cable, e.g., power cable 315a, may be fed through the duct slot, with extra power cable remaining within cable duct 605 in the form of a bight, e.g., bight 325a. Once the power cable is so positioned, a duct cover, e.g., duct cover 130a, would be repositioned to retain the power cable within cable duct 605.

Figure 6B:
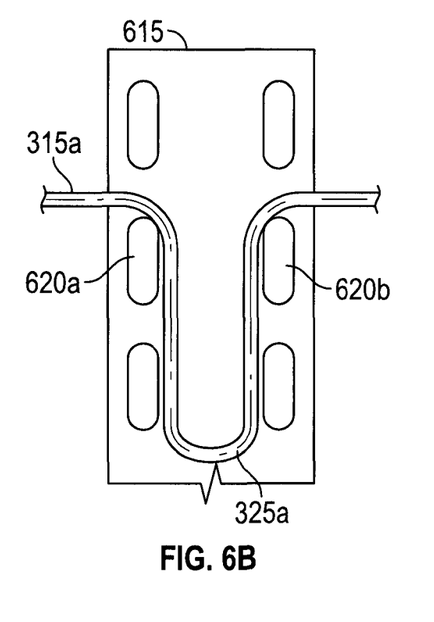
FIG. 6b is a drawing illustrating aspects of an embodiment of cable duct.

FIG. 6b is another drawing illustrating an embodiment of cable duct 125. In FIG. 6b, a cable duct 615 is one embodiment of cable duct 125 depicted in FIGS. 1-5. Cable duct 615 is shown without a duct cover for clarity. Cable duct 615 include duct beams 620a, 620b for supporting a power cable. A space created between duct beams 620a, 620b may accept excess power cable slack. Thus, a duct slot, e.g., duct slot 135c, may be created by the space between upper and lower pairs of duct beams and a power cable, e.g., power cable 315a, may be fed through the duct slot, with extra power cable remaining within cable duct 615 in the form of a bight, e.g., bight 325a. Once the power cable is so positioned, a duct cover, e.g., duct cover 130a, would be repositioned to retain the power cable within the cable duct 615.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. For example, one skilled in the art will recognize that these embodiments can be practiced without one or more of the specific details, or with other components, systems, etc. And, in other instances, there may be structures or operations not shown, or not described in detail, to avoid obscuring aspects of the described embodiments. Therefore, the scope of the appended claims should be accorded the broadest interpretation so as to encompass all such modifications and similar arrangements.

What is claimed is:

1. A rack door for mounting at least one power distribution unit (PDU) and for providing access to PDU receptacles from both sides of the rack door, the rack door being mountable to a rack, the rack door comprising:
 a first face, a second face opposing the first face, a first edge, and a second edge opposing the first edge, the rack door configured near the first edge to mount to a front section of a rack such that the rack door may open and close with respect to the rack;
 a first PDU mount disposed on the first face for mounting a first PDU such that a first plurality of PDU power output sockets are oriented toward the first edge;
 a first open space disposed between the first PDU mount and the first edge and configured to allow access from the second face through the rack door to each of the first plurality of PDU power output sockets when the first PDU is mounted.

2. The rack door of claim 1 further comprising:
 a second PDU mount disposed on the first face for mounting a second PDU such that a second plurality of PDU power output sockets are oriented toward the first edge;
 a second open space disposed between the second PDU mount and the first PDU mount and configured to allow access from the second face through the rack door to each of the second plurality of PDU power output sockets when the second PDU is mounted, the second PDU mount and the second open space disposed on the rack door such that the first and second open spaces allow a routing of each of the second plurality of power cables from the second PDU through the second open space, along a section of the second face, then through the first open space to the first edge, the routing allowing the mounting or dismounting of the first PDU without disconnecting cables from the second PDU, and allowing the mounting or dismounting of the second PDU without disconnecting cables from the first PDU.

3. The rack door of claim 2 further comprising a cable duct disposed near the first edge and having a plurality of entry openings, a corresponding plurality of exit openings, and a cable space between the pluralities of entry and exit openings, the cable space for housing excess cable.

4. The rack door of claim 2, the second PDU mount offset with respect to the first PDU mount such that, when first and second PDUs are mounted, the first plurality of PDU power output sockets are staggered with respect to the second plurality of PDU power output sockets, the staggering reducing the overlap of power cables from the first PDU with power cables from the second PDU when power cables are connected to the first and second PDUs.

5. The rack door of claim 2, the first PDU mount, first open space, second PDU mount and second open space being disposed in a top half of the rack door, the rack door further comprising:
 a third PDU mount disposed on the first face for mounting a third PDU such that a third plurality of PDU power output sockets are oriented toward the first edge;
 a third open space disposed between the third PDU mount and the first edge and configured to allow access from the second face through the rack door to each of the third plurality of PDU power output sockets when the third PDU is mounted; and
 a fourth PDU mount disposed on the first face for mounting a fourth PDU such that a fourth plurality of PDU power output sockets are oriented toward the first edge;
 a fourth open space disposed between the fourth PDU mount and the third PDU mount and configured to allow access from the second face through the rack door to each of the fourth plurality of PDU power output sockets when the fourth PDU is mounted, the fourth PDU mount and the fourth open space disposed on the rack door such that the third and fourth open spaces allow a routing of a power cable from the fourth PDU through the fourth open space, along a section of the second face, then through the third open space to the first edge, the routing allowing the mounting or dismounting of the third PDU without disconnecting cables from the fourth PDU and the routing allowing the mounting or dismounting of the fourth PDU without disconnecting cables from the third PDU.

6. The rack door of claim 5, the first, second, third, and fourth PDUs being half-height PDUs.

7. The rack door of claim 3 further comprising a plurality of cable clips attached to the second face between the first and second open spaces, the plurality of cable clips for providing stability for a power cable running from the second PDU to the cable duct.

8. The rack door of claim 3, the duct being disposed on the first face.

9. The rack door of claim 1 further comprising:
 a second PDU mount disposed on the first face for mounting a second PDU such that a second plurality of PDU power output sockets are oriented away from the first edge, the orientation allowing a routing of a power cable from the second PDU along the second face then through the first open space to the first edge, the routing allowing the mounting or dismounting of the first PDU without disconnecting cables from the second PDU and the routing allowing the mounting or dismounting of the second PDU without disconnecting cables from the first PDU.

10. The rack door of claim 9 further comprising a cable duct disposed near the first edge and having a plurality of entry openings, a corresponding plurality of exit openings, and a cable space between the pluralities of entry and exit openings, the cable space for housing excess cable.

11. The rack door of claim 10 further comprising a plurality of cable clips attached to the second face between the first open space and the second edge, the plurality of cable clips for providing stability for a power cable running from the second PDU to the cable duct.

12. The rack door of claim 1 mounted to a rack.

13. The rack door of claim 1, the first PDU mount configured to mount a first PDU, the first PDU having a first length, the rack door further including a second PDU mount for mounting a second PDU with a second length, the second PDU mount configured to mount the second PDU in place of the first PDU.

14. The rack door of claim 13, the first PDU mount including a first slot and a second slot, the second PDU mount including the first and a third slot.

15. The rack door of claim 1, the access from the second face through the rack door allowing power cables to be individually connected or disconnected from each of the first plurality of PDU power output sockets.

16. The rack door of claim 1 further comprising a latch, the latch configured to engage both a first type of hardware and a second type of hardware.

17. The rack door of claim 16, the latch requiring an adjustment to engage the second type of hardware.

18. The rack door of claim 1, further comprising a multiple-detent hinge.

19. A rack door for mounting at least one power distribution unit (PDU) and for providing access to PDU receptacles from both sides of the rack door, the rack door being mountable to a rack, the rack door comprising:
- a first face, a second face opposing the first face, a first edge, and a second edge opposing the first edge, the rack door configured near the first edge to mount to a front section of a rack such that the rack door may open and close with respect to the rack;
- a first PDU mount disposed on the first face for mounting a first PDU such that a first plurality of PDU power output sockets are oriented toward the second edge;
- a first open space disposed between the first PDU mount and the second edge and configured to allow access from the second face through the rack door to each of the first plurality of PDU power output sockets when the first PDU is mounted.

20. The rack door of claim 19 further comprising:
a second PDU mount disposed on the first face near the second edge for mounting a second PDU such that a second plurality of PDU power output sockets are oriented toward the first edge, the first open space also allowing access from the second face through the rack door to each of the second plurality of PDU power output sockets when the second PDU is mounted, the second PDU mount and the first open space disposed on the rack door such that the first open space is between the first and second PDU mounts and the first open space allows a routing of each of the second plurality of power cables from the second PDU through the first open space, along a section of the second face, then to the first edge, the routing allowing the mounting or dismounting of the first PDU without disconnecting cables from the second PDU, and allowing the mounting or dismounting of the second PDU without disconnecting cables from the first PDU.

* * * * *